United States Patent
Pullen

(10) Patent No.: US 8,482,307 B2
(45) Date of Patent: Jul. 9, 2013

(54) METHOD AND APPARATUS FOR THE PREVENTION OF UNTESTED OR IMPROPERLY TESTED PRINTED CIRCUIT BOARDS FROM BEING USED IN A FIRE PUMP CONTROL SYSTEM

(75) Inventor: William R. Pullen, Kernersville, NC (US)

(73) Assignee: Hubbell Incorporated, Shelton, CT (US)

( * ) Notice: Subject to any disclaimer, the term of this patent is extended or adjusted under 35 U.S.C. 154(b) by 469 days.

(21) Appl. No.: 12/801,350

(22) Filed: Jun. 4, 2010

(65) Prior Publication Data

US 2010/0308853 A1 Dec. 9, 2010

Related U.S. Application Data

(60) Provisional application No. 61/213,415, filed on Jun. 5, 2009.

(51) Int. Cl.
*G01R 31/10* (2006.01)
*G01R 31/28* (2006.01)

(52) U.S. Cl.
USPC .................................. 324/750.05; 324/763.01

(58) Field of Classification Search
USPC ................. 324/750.01–750.3, 762.01–762.1, 324/763.01; 257/48; 438/14–14
See application file for complete search history.

(56) References Cited

U.S. PATENT DOCUMENTS

| | | | |
|---|---|---|---|
| 4,419,747 A | 12/1983 | Jordan | |
| 4,578,773 A | 3/1986 | Desai | |
| 4,829,520 A | 5/1989 | Toth | |
| 4,970,726 A | 11/1990 | Carn | |
| 5,642,307 A | 6/1997 | Jernigan | |
| 5,950,150 A | 9/1999 | Lloyd | |
| 6,118,288 A * | 9/2000 | Kang | 324/750.22 |
| 6,209,110 B1 | 3/2001 | Chhor | |
| 6,496,945 B2 | 12/2002 | Cepulis | |
| 6,651,900 B1 | 11/2003 | Yoshida | |
| 6,829,737 B1 | 12/2004 | McBride | |
| 6,963,513 B2 | 11/2005 | Yamamoto | |
| 7,107,184 B2 | 9/2006 | Gentile | |
| 7,126,196 B2 | 10/2006 | Zhang | |
| 7,155,300 B2 | 12/2006 | Akram | |
| 7,289,445 B2 * | 10/2007 | Illikkal et al. | 370/235 |
| 7,380,054 B2 | 5/2008 | Okada | |
| 2003/0217247 A1 | 11/2003 | Abramovitz | |
| 2004/0065450 A1 | 4/2004 | Yoshida | |

* cited by examiner

*Primary Examiner* — Tung X Nguyen

(74) *Attorney, Agent, or Firm* — Christian C. Michel; Mark S. Bicks; Alfred N. Goodman

(57) ABSTRACT

The present invention relates to a method and apparatus for preventing untested or improperly tested printed circuit boards from being used in a fire pump control system by interrogating each printed circuit board to ensure post-assembly fitness. Exemplary embodiments of the present invention comprise retrieving test status information stored on non-volatile memory of a printed circuit board, verifying the test status information stored on the non-volatile memory of the PCB, determining if all tests performed on the PCB have passed, outputting a message regarding the status of the PCB, and continuing to interrogate each additional PCB in the fire pump controller. A pass flag is set and recorded on the non-volatile memory of a respective PCB if all tests on the respective PCB have passed. Whereas, an error flag is set and recorded on the non-volatile memory if at least one test on a respective PCB has failed.

18 Claims, 3 Drawing Sheets

METHOD AND APPARATUS FOR THE PREVENTION OF UNTESTED OR IMPROPERLY TESTED PRINTED CIRCUIT BOARDS FROM BEING USED IN A FIRE PUMP CONTROL SYSTEM

CROSS-REFERENCE TO RELATED APPLICATIONS

This application claims the benefit of the filing date of U.S. Provisional Patent Application Ser. No. 61/213,415, filed on Jun. 5, 2009, the entire disclosure of which is hereby incorporated by reference.

BACKGROUND OF THE INVENTION

1. Field of the Invention

The present invention relates to a method and apparatus for ensuring post-assembly fitness of printed circuit boards for use in a safety-related system and ensuring defective printed circuit board assemblies are not utilized in finished products. More particularly, the present invention relates to a method and apparatus for preventing untested or improperly tested printed circuit boards from being used in a fire pump control system by interrogating each printed circuit board to ensure post-assembly fitness.

2. Description of Related Art

Printed circuit boards (PCBs) are typically tested during various points during its manufacturing process. After a particular test or test sequence has been completed, the PCBs that have failed a test may be separated from the PCBs that have passed all tests. The functional PCBs are usually ink-stamped or similarly marked to indicate that the PCBs have passed all tests prior to shipping to a customer. Typically, no records are maintained concerning the tests performed on each PCB or the results thereof.

An unfortunate outcome of the conventional test sequence is a lack of quality control. For instance, a faulty PCB may inadvertently be sorted with the functional PCBs, and therefore be erroneously marked as having passed all tests performed on it. The faulty PCB is then shipped to an unknowing consumer who will install the faulty PCB into a fire pump control system assuming that the faulty PCB is fully functional due to the erroneous mark of approval.

The faulty PCB in the fire pump control system may not be exposed until the fire pump control system as a whole ceases to operate correctly or fails a routine safety inspection.

Since no test record for the faulty PCB is maintained by the manufacturer, this typically results in a very time-intensive process requiring that each PCB component be removed from the faulty fire pump control system and similarly placed inside a working fire pump controller system in order to be properly tested. A hardware diagnostic test is usually run to test whether each PCB component from the faulty fire pump system is working properly. This lengthy process continues until the faulty PCB component is isolated and replaced.

The conventional alternative to the time-intensive process described above, is to simply replace the entire faulty fire pump control system. This, however, is a costly option since many fully functional PCB components in the faulty fire pump control system may be discarded unnecessarily.

Accordingly, there is a need for an improved method and apparatus that decreases the cost and complexity of replacing a faulty PCB in a fire pump control system by preventing untested or improperly tested printed circuit boards from being used in a fire pump control system.

Such a method and apparatus preferably would store the test results of each PCB component on its non-volatile memory to provide a more extensive and long-term record than the contemporary method of merely noting test results by ink-stamping or marking the PCB component.

Additionally, such a method and apparatus preferably would maintain a test history of each PCB on its non-volatile memory so that the test history of the PCB can be instantaneously probed by a fire pump control system operator upon installation, thus eliminating the cost and complexity of having to retest individual components of a fire pump control.

Further, such a method and apparatus preferably would automatically interrogate and verify the fitness of each PCB component in a fire pump control system, thus improving the efficiency and cost of manually testing each of the PCB components.

SUMMARY OF THE INVENTION

Exemplary embodiments of the present invention address at least the above problems and/or disadvantages and provide at least the advantages described below. Accordingly, an aspect of an exemplary embodiment of the present invention is to provide system and method for interrogating each printed circuit board (PCB) in a fire pump control system to ensure post-assembly fitness of the PCBs.

An aspect of exemplary embodiments of the present invention is to provide a computer-implemented method for interrogating each PCB in a fire pump controller to ensure post-assembly fitness, the method comprising the steps of (a) retrieving test status information stored on non-volatile memory of a printed circuit board, (b) verifying the test status information stored on the non-volatile memory of the PCB, (c) determining if all tests performed on the PCB have passed, (d) outputting a message regarding the status of the PCB, and (e) continuing steps (a)-(d) for each additional PCB in the fire pump controller.

According to an exemplary embodiment of the present invention, a pass flag is set and recorded on the non-volatile memory of a respective PCB if all tests on the respective PCB have passed.

According to an exemplary embodiment of the present invention, an error flag is set and recorded on the non-volatile memory if at least one test on a respective PCB has failed.

According to another exemplary embodiment of the present invention, an error flag is set if the test status information of a respective PCB is incomplete or corrupted, indicates that the PCB is new or mismatched, or indicates that a functional or burn-in test has failed.

According to an exemplary embodiment of the present invention, the test status information includes a test date, a test operator, and a pass/fail test result of a functional test of a respective PCB.

According to another exemplary embodiment of the present invention, the test status information includes a test date, a test operator, and a pass/fail test result of a burn-in test of a respective PCB.

According to an exemplary embodiment of the present invention, the method can be performed wirelessly from a remote client machine.

According to an exemplary embodiment of the present invention, the non-volatile memory is an electrically erasable programmable read-only memory (EEPROM).

According to another exemplary embodiment of the present invention, the EEPROM of each respective PCB stores at least one of a part number, a revision number, a PCB serial number, a control system serial number, a functional test date, a functional test operator, a functional test result, a burn-in test date, a burn-in test operator, a burn-in test result, and flags.

Another aspect of exemplary embodiments of the present invention is to provide a computer apparatus containing a data processor with programmed instructions for interrogating test status information data transmitted from each printed circuit board (PCB) of a fire pump controller, said computer apparatus comprising (a) computer-executable instructions for retrieving test status information stored on non-volatile memory of a PCB, (b) computer-executable instructions for verifying the test status information stored on the non-volatile memory of the PCB, (c) computer-executable instructions for determining if all tests performed on the PCB have passed, (d) computer-executable instructions for outputting a message regarding the status of the PCB, and (e) computer-executable instructions for continuing instructions (a)-(d) for each additional PCB in the fire pump controller.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain embodiments of the present invention will be more apparent from the following description taken in conjunction with the accompanying drawings, in which.

Throughout the drawings, like reference numerals will be understood to refer to like parts, components, and structures.

DETAILED DESCRIPTION OF EXEMPLARY EMBODIMENTS

The matters defined in the description such as a detailed construction and elements are provided to assist in a comprehensive understanding of the embodiments of the invention. Accordingly, those of ordinary skill in the art will recognize that various changes and modifications of the embodiments described herein can be made without departing from the scope and spirit of the invention. Also, descriptions of well-known functions and constructions are omitted for clarity and conciseness.

The present invention generally relates to a method and apparatus for preventing untested or improperly tested printed circuit board (PCB) components from being used in a fire pump control system by interrogating each PCB to ensure post-assembly fitness.

Figure 1:
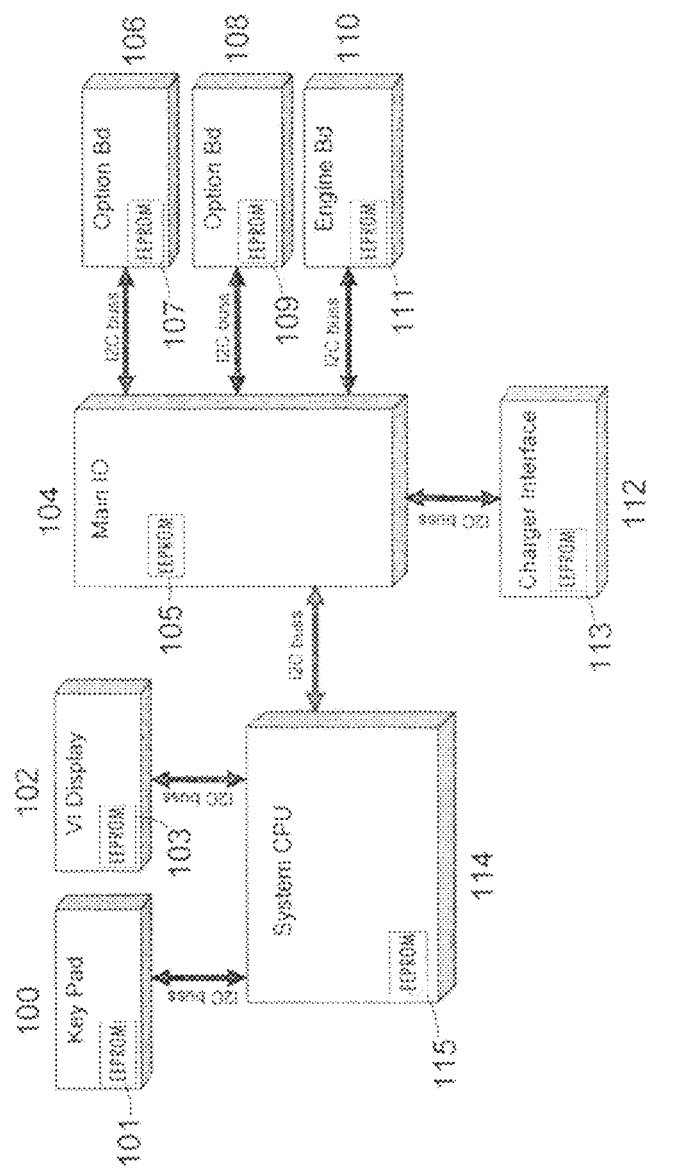
FIG. 1 is a block diagram illustrating the system communication among printed circuit boards in a fire pump control system of an embodiment of the present invention.

Referring to FIG. 1, a fire pump control system according to an exemplary embodiments of the present invention includes various PCB components including, but not limited to, a keypad PCB 100, a display PCB 102, a main input/output (I/O) PCB 104, option PCBs 106, 108, an engine PCB 110, a charger interface PCB 112, and a system computer unit (CPU) PCB 114.

Each PCB 100, 102, 104, 106, 108, 110, 112, 114 of the fire pump control system comprises a memory device for storing, in a system readable format, PCB specific information including, but not limited to, the PCB part number, the PCB revision number, the PCB serial number, the control system serial number, a functional test date, a functional test operator, a functional test result, a burn-in test date, a burn-in test operator, a burn-in test result, and various flags.

The memory device preferably includes non-volatile memory such as, but not limited to, programmable read only memory (PROM), erasable programmable read only memory (EPROM), electrically erasable programmable read only memory (EEPROM), and flash memory. EEPROM's are shown in the embodiment illustrated in FIG. 1, but one of ordinary skill in the art will recognize that any suitable non-volatile memory could be used.

As shown in FIG. 1, each PCB 100, 102, 104, 106, 108, 110, 112, 114 comprises a respective EEPROM 101, 103, 105, 107, 109, 111, 113, 115 for storing respective PCB test status information.

During the manufacturing process, and prior to installation of a PCB onto the fire pump controller system board, each PCB is subjected to a variety of manufacturing tests wherein test signals may be sent to the PCB in sequence by a PCB device tester. Values received or read from the device are compared with expected values.

A first functionality test is performed to verify that the PCB and its respective non-volatile memory, e.g., EEPROM, are fully functional and operating correctly. The pass/fail results from the first functionality test are ultimately stored on the EEPROM of the tested PCB.

A burn-in test is then performed on each PCB wherein a particular combination of signals are delivered repetitively, under extreme environmental conditions (temperature, voltage, etc.) in order to identify the PCB components that would fail after a shorter than usual period of use. The pass/fail results from the burn-in test are also stored on the EEPROM of the tested PCB.

A second functionality test is performed to verify that the PCB and its respective non-volatile memory, e.g., EEPROM, are fully functional and operating correctly after having been subjected to the burn-in test.

At each step of the testing of the PCB during the manufacturing process, test status information such as the test operator, test date, and pass/fail information is electronically recorded onto the respective non-volatile memory of the PCB, which is physically located on the PCB. Thus, each PCB carries its own test history. This recorded data is expected to last well past the service life of the PCB.

Accordingly, after each PCB 100, 102, 104, 106, 108, 110, 112, 114 is thoroughly tested during the manufacturing process, as described above, the PCB is then installed onto the fire pump controller system board, as shown in FIG. 1.

Figure 2:
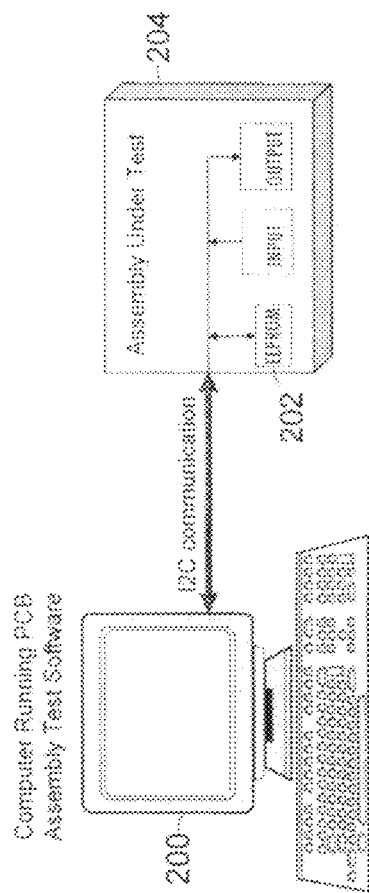
FIG. 2 is a block diagram illustrating testing access to the non-volatile memory of the printed circuit board component according to an exemplary embodiment of the invention.

As shown in FIG. 2, a computer unit (CPU) 200 executing PCB post-assembly interrogation software can be connected to the assembly under test 204 (i.e., PCB) and its EEPROM 202 via I2C bus communication. In another embodiment of the present invention, the connection between the CPU 200 and the assembly under test 204 may also be wireless in order to allow the CPU to remotely interrogate each of the PCBs installed in the fire pump controller system.

Figure 3:
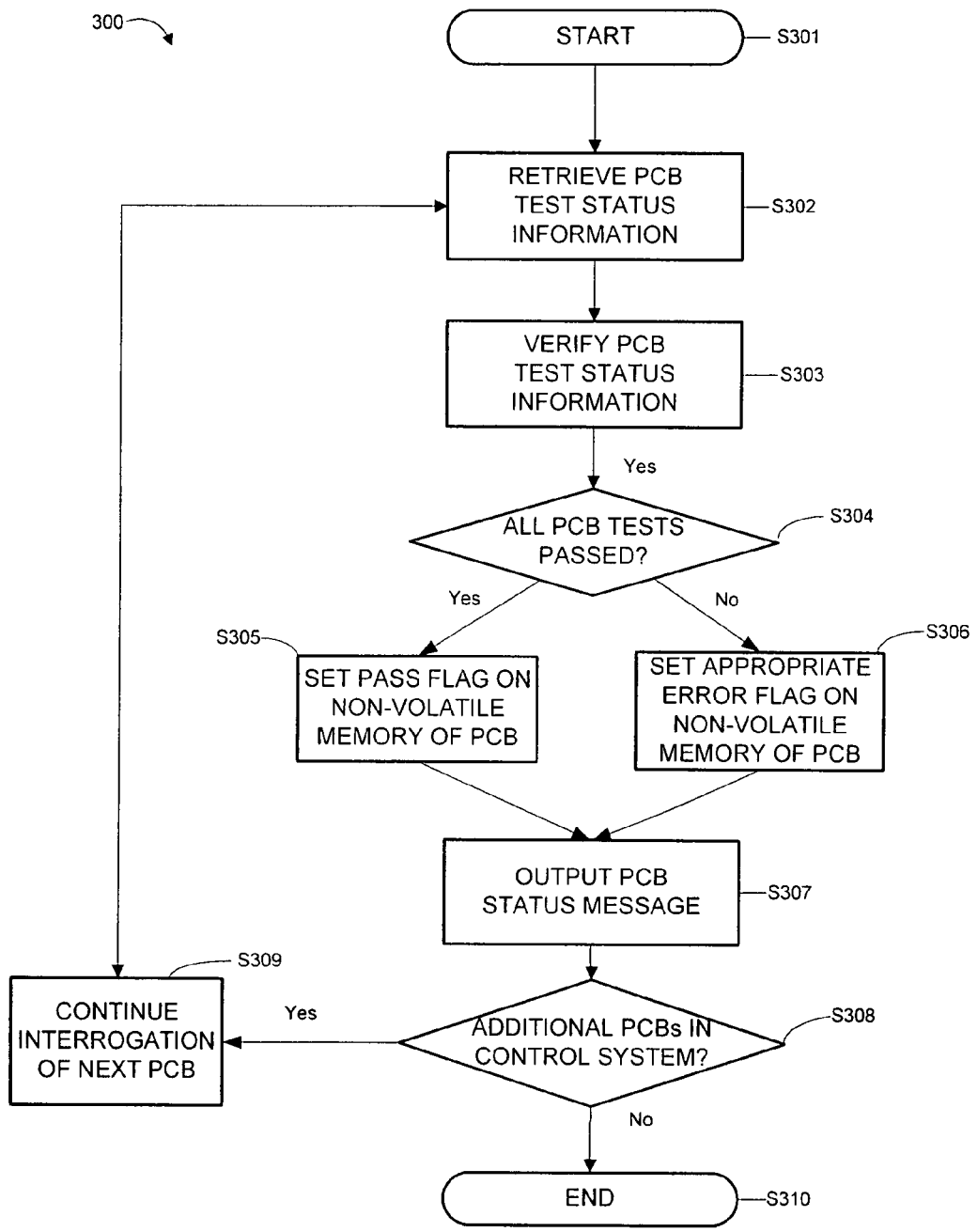
FIG. 3 is a flow diagram illustrating the method of interrogating each printed circuit board in a fire pump control system according to exemplary embodiments of the present invention.

Referring to FIG. 3, an exemplary method 300 according to an exemplary embodiment of the present invention for interrogating each post-installation PCB in a fire pump control system to ensure that the PCB had passed all required tests will now be described.

Upon powering-up the CPU 200 and initializing the PCB post-assembly interrogation software, the computer-executable instructions of the software will begin execution at step S301, and attempt to retrieve the test status information stored on the non-volatile memory of a first PCB in the fire pump control system at step S302.

The computer-executable instructions of embodiments of the present invention will then verify the post-assembly fitness of the first PCB by accessing and attempting to read the test status information stored on the non-volatile memory of the first PCB at step S303.

The verification process validates that the test status information stored on the non-volatile memory of the PCB is complete, readable and non-corrupted. Furthermore, the verification process validates that the PCB is not new or mismatched to the fire pump control system in which the PCB is installed. Finally, the process verifies that the test status information includes an indication of whether functional and burn-in tests were performed on the PCB during the manufacturing process.

At step S304, test status information is checked to determine if all of the tests performed on the PCB have been passed. If the test status information indicates that all of the tests performed on the PCB have been passed, a pass flag is set to indicate that all PCB tests have passed at step S305. In other words, if the test status information stored on the non-volatile memory of the PCB indicates that the PCB is complete, readable, and non-corrupted; confirms that the PCB is not new or mismatched to the control system; and validates that all functional and burn-in tests were conducted and passed during the manufacturing process, then a pass flag is set on the non-volatile memory of the PCB.

If one or more tests performed on the PCB have failed according to the test status information stored on the non-volatile memory of the PCB, then an appropriate error flag is set on the non-volatile memory for each respective failure indicated at step S306.

The computer-executable instructions of embodiments of the present invention then output a status message on the display of the fire pump control system indicating whether the PCB has passed all tests or whether certain tests performed on the PCB have failed at step S307.

For example, if the status test information of the PCB indicates that one of the functional or burn-in tests performed during the manufacturing process had failed, then the fire pump controller display may output a board failure error alert to warn the system operator that the PCB should be replaced. Moreover, if the status test information of the PCB is incomplete, corrupted or unreadable, then the fire pump controller display may output an input/output error to alert the system operator that the PCB should be replaced. Additionally, if the status test information of the PCB indicates that the PCB is a new board, then the controller display may output an option to the system operator to integrate the serial number of the new PCB to the control system serial number. Furthermore, if the status test information of the PCB indicates that the PCB is a mismatched board due to inconsistencies between the control system serial number and the PCB serial number, then the controller display may output an alert to the system operator warning that the PCB may be a counterfeit and should be replaced.

Finally, upon a successful read of valid test status information indicating that all tests performed on the PCB have passed, the fire pump controller display will indicate that the PCB is fully fit for proper functionality within the fire pump control system at step S307.

Exemplary embodiments of the present invention also envision that an audio PCB status message (e.g., voice, beep, siren, etc.) may be outputted in addition to or in lieu of the visual PCB status message display discussed above.

After the interrogation of the first PCB of the fire pump control system is complete, the computer-executable instructions of embodiments of the present invention then check to see if there are additional PCBs that need to be verified in the fire pump control system at step S308.

If there exists additional PCBs to be verified in the fire pump control system, the computer-executable instructions will continue to interrogate the next PCB at step S309 in the same manner as described above and shown in steps S302-S307 of FIG. 3.

Even if a failed PCB is encountered, it is advantageous to continue interrogating and verifying each PCB in a fire pump control system in order to determine if there are additional PCBs that may have failed at least one test. By interrogating all of the PCBs in the fire pump control system, the system operator is alerted to every defective PCB in the fire pump control system, thus improving the efficiency and cost of having to re-execute the software after replacing the first defective PCB.

The computer-executable instructions of embodiments of the present invention will continue to automatically verify and determine the fitness of each PCB in the fire pump control system by interrogating each PCB and determining whether the PCB has passed all tests performed upon it or whether the PCB has failed at least one test performed upon it.

The method and apparatus of embodiments of the present invention ensures in a time and cost-effective manner that all the PCBs of a fire pump controller system are in proper working order. Otherwise, the method and apparatus of embodiments of the present invention isolates the defective PCBs in a time and cost-effective manner.

The present invention can also be embodied as computer-readable codes on a computer-readable recording medium. The computer-readable recording medium is any data storage device that can store data which can thereafter be read by a computer system. Examples of the computer-readable recording medium include, but are not limited to, read-only memory (ROM), random-access memory (RAM), CD-ROMs, magnetic tapes, floppy disks, and optical data storage devices. The computer-readable recording medium can also be distributed over network-coupled computer systems so that the computer-readable code is stored and executed in a distributed fashion. Also, functional programs, codes, and code segments for accomplishing the present invention can be easily construed as within the scope of the invention by programmers skilled in the art to which the present invention pertains.

While certain exemplary embodiments of the invention have been shown and described herein with reference to certain preferred embodiments thereof, it will be understood by those skilled in the art that various changes in form and details may be made therein without departing from the spirit and scope of the invention as defined by the appended claims and their equivalents.

What is claimed is:

1. A computer-implemented method for interrogating each printed circuit board (PCB) in a fire pump controller to ensure post-assembly fitness, the method comprising the steps of:
   (a) retrieving test status information stored on non-volatile memory of a printed circuit board;
   (b) verifying the test status information stored on the non-volatile memory of the PCB;

(c) determining if all tests performed on the PCB have passed;

(d) outputting a message regarding the status of the PCB; and (e) continuing steps (a)-(d) for each additional PCB in the fire pump controller.

2. The computer-implemented method of claim 1, wherein a pass flag is set and recorded on the non-volatile memory of a respective PCB if all tests on the respective PCB have passed.

3. The computer-implemented method of claim 1, wherein an error flag is set and recorded on the non-volatile memory if at least one test on a respective PCB has failed.

4. The computer-implemented method of claim 1, wherein an error flag is set if the test status information of a respective PCB is incomplete or corrupted, indicates that the PCB is new or mismatched, or indicates that a functional or burn-in test has failed.

5. The computer-implemented method of claim 1, wherein the test status information includes a test date, a test operator, and a pass/fail test result of a functional test of a respective PCB.

6. The computer-implemented method of claim 1, wherein the test status information includes a test date, a test operator, and a pass/fail test result of a burn-in test of a respective PCB.

7. The computer-implemented method of claim 1, wherein steps (a)-(e) can be performed wirelessly from a remote client machine.

8. The computer-implemented method of claim 1, wherein the non-volatile memory is an electrically erasable programmable read-only memory (EEPROM).

9. The computer-implemented method of claim 8, wherein the EEPROM of each respective PCB stores at least one of a part number, a revision number, a PCB serial number, a control system serial number, a functional test date, a functional test operator, a functional test result, a burn-in test date, a burn-in test operator, a burn-in test result, and flags.

10. A computer apparatus containing a data processor with programmed instructions for interrogating test status information data transmitted from each printed circuit board (PCB) of a fire pump controller, said computer apparatus comprising:

(a) computer-executable instructions for retrieving test status information stored on non-volatile memory of a PCB;

(b) computer-executable instructions for verifying the test status information stored on the non-volatile memory of the PCB;

(c) computer-executable instructions for determining if all tests performed on the PCB have passed;

(d) computer-executable instructions for outputting a message regarding the status of the PCB; and (e) computer-executable instructions for continuing instructions (a)-(d) for each additional PCB in the fire pump controller.

11. The computer apparatus of claim 10, wherein a pass flag is set and recorded on the non-volatile memory of a respective PCB if all tests on the respective PCB have passed.

12. The computer apparatus of claim 10, wherein an error flag is set and recorded on the non-volatile memory if at least one test on a respective PCB has failed.

13. The computer apparatus of claim 10, wherein an error flag is set if the test status information of a respective PCB is incomplete or corrupted, indicates that the PCB is new or mismatched, or indicates that a functional or burn-in test has failed.

14. The computer apparatus of claim 10, wherein the test status information includes a test date, a test operator, and a pass/fail test result of a functional test of a respective PCB.

15. The computer apparatus of claim 10, wherein the test status information includes a test date, a test operator, and a pass/fail test result of a burn-in test of a respective PCB.

16. The computer apparatus of claim 10, wherein computer-executable instructions (a)-(e) can be performed wirelessly from a remote computer.

17. The computer apparatus of claim 10, wherein the non-volatile memory is an electrically erasable programmable read-only memory (EEPROM).

18. The computer apparatus of claim 17, wherein the EEPROM of each respective PCB stores at least one of a part number, a revision number, a PCB serial number, a control system serial number, a functional test date, a functional test operator, a functional test result, a burn-in test date, a burn-in test operator, a burn-in test result, and flags.

* * * * *